(12) United States Patent
Lee

(10) Patent No.: US 6,795,800 B1
(45) Date of Patent: Sep. 21, 2004

(54) SIMPLIFIED METHOD FOR EXTRACTING MODEL PARAMETER SETS AND METHOD FOR STATISTICALLY SIMULATING INTEGRATED CIRCUIT USING THE SAME

(75) Inventor: Sang-hoon Lee, Anyang (KR)

(73) Assignee: Samsung Electronics Co., Ltd., Suwon (KR)

(*) Notice: Subject to any disclaimer, the term of this patent is extended or adjusted under 35 U.S.C. 154(b) by 756 days.

(21) Appl. No.: 09/696,816

(22) Filed: Oct. 25, 2000

(30) Foreign Application Priority Data

Oct. 26, 1999 (KR) .......................................... 1999-46630

(51) Int. Cl.[7] .................................................. G06F 7/60
(52) U.S. Cl. .............................. 703/2; 700/30; 700/31; 703/131.4
(58) Field of Search .............................. 703/2, 22, 14, 703/13; 700/29, 30, 31

(56) References Cited

U.S. PATENT DOCUMENTS

| | | | |
|---|---|---|---|
| 5,790,436 A | | 8/1998 | Chen et al. |
| 6,106,563 A | * | 8/2000 | Stengel et al. ................. 703/13 |
| 6,330,526 B1 | * | 12/2001 | Yasuda ........................... 703/2 |
| 6,381,564 B1 | * | 4/2002 | Davis et al. ................... 703/22 |
| 6,560,568 B1 | * | 5/2003 | Singhal et al. ................. 703/2 |

OTHER PUBLICATIONS

Narain Arora, "MOSFET Models for VLSI Circuit Simulation theory and practice", 1993, pp. 510–535.
James C. Chen et al., "E–T Based Statistical Modeling and Compact Statistical Circuit Simulation Methodologies", 1996 IEEE, pp. 23.6.1–23.6.4.
Star–Hspice User's Manual, Release 1998.2, "Analyzing Electric Yields,"(10–31 to 10–38), 8 pages.

* cited by examiner

*Primary Examiner*—Albert W. Paladini
(74) *Attorney, Agent, or Firm*—Marger Johnson & McCollom, P.C.

(57) ABSTRACT

A method of simulating the performance of an integrated circuit design is provided. In the case of extracting n model parameter sets in order to statistically simulate the performance of the integrated circuit, it is possible to significantly reduce the time spent on extracting the model parameters by extracting only one model parameter set using the I-V characteristic curve created by directly measuring the I-V characteristic of the device as a target function and extracting the remaining (n–1) model parameter sets using the main characteristic data (ET data) which can be easily measured such as the threshold voltage or the saturation current of the device as the target function. Since the main characteristic data (ET data) of the device is used as the target function, it is possible to easily extract the model parameter set when the characteristics of the device are changed. Therefore, the designer can simply estimate the influence (sensitivity) that the changes in the characteristics of the device have on the performance of the integrated circuit design.

12 Claims, 4 Drawing Sheets

SIMPLIFIED METHOD FOR EXTRACTING MODEL PARAMETER SETS AND METHOD FOR STATISTICALLY SIMULATING INTEGRATED CIRCUIT USING THE SAME

BACKGROUND OF THE INVENTION

1. Field of the Invention

The present invention relates to a process of designing an integrated circuit, and more particularly, to a method for extracting a plurality of model parameters required for simulating the operation and the performance of a circuit design and a method for simulating the operation and the performance of the circuit.

2. Description of the Related Art

It is essential to determine whether integrated circuit designs will operate as desired, how the performance of the integrated circuit will be, and how the statistical distribution and deviation of the performances will be, and to feed back the simulation results into the design process. Such a simulation is performed using a widely known program, which is referred to as SPICE. The SPICE program requires information on the layout of devices such as the sizes of the circuit devices, the length of signal paths therebetween and various model parameters showing the characteristic performance of the devices and the overall interconnected circuit. Model parameters may have physical meaning such as the length $X_l$ and the width $X_w$ of a channel, the thickness $t_{ox}$ of a gate insulating layer, and the change $\Delta V_{th}$ in a threshold voltage according to the change in the doping concentration of a channel region. Other model parameters may indicate simple coefficients of a SPICE model equation. The process of extracting model parameters for a circuit is a complicated and time-consuming task, with many measurements and much trial and error. The general process of extracting model parameters will be described as follows, taking a transistor device as an example.

Drain currents with respect to gate-source voltages $V_{GS}$ and drain-source voltages $V_{DS}$ are measured and an I-V characteristic curve is prepared. The I-V characteristic curve can be measured, while changing the operating voltage $V_{CC}$, the substrate bias voltage $V_{BB}$, the length and the width of a channel, and device temperature. As a result, various I-V characteristic curves are created.

In the I-V characteristic curves shown in FIG. 1, results of measuring drain current $I_D$ according to the change in the gate-source voltage $V_{GS}$, the drain-source voltage $V_{DS}$, the substrate bias voltage $V_{BB}$ and the operating voltage $V_{CC}$, are shown. In FIG. 1, I-V characteristic curves with respect to predetermined length and width of a channel and a predetermined temperature are shown. Various I-V characteristic curves which are similar to the I-V characteristic curves shown in FIG. 1 are created as the length and the width of the channel and the temperature are changed. Because of all the variables, the number of times that a drain current value is measured can be several hundreds through several thousands. Typically, the transistor devices for measuring the current value according to the change in a voltage are referred to as a test element group (TEG) formed in an unused area, e.g., a scribe line between one chip and another chip, of a wafer on which mass-produced integrated circuit chips are formed.

The process of extracting model parameters includes 1) substituting initial values into the model parameters for the I-V calculating equation of the SPICE program; 2) performing the needed calculations based on such initial values; and 3) changing the initial values until the calculation results converge on actual (measured) I-V characteristic curves. These steps are repeated until convergence is within a predetermined tolerance. Values obtained when the calculation results converge on the actually measured I-V characteristic curves become the model parameters. The model parameters of a previously known device having the characteristics closest to those of the currently designed device are typically used as initial values. The model parameters are preferably a set which converges on the measured I-V characteristic curves, while changes to the length and the width of the channel, the temperature during measurement, an operating voltage, and a substrate bias voltage concurrently are made.

The model parameter set obtained as described above is substituted for the input variable to the SPICE model equation, and device and circuit performance characteristics, e.g. speed, are calculated.

In order to determine the degree and deviation to which the performance of a circuit may vary according to the position of the circuit on a wafer or the position of a wafer in a wafer cassette, simulation is performed not on only one device but on plural devices variously positioned on one or more wafers (refer to U.S. Pat. No. U.S. 5,790,436). In this case, the above mentioned process of extracting the model parameter set must be repeated with respect to each device and wafer position to create a plurality of model parameter sets. Those of skill will appreciate that this is a complicated and time-consuming task.

A method of extracting the model parameter set using electrical test (ET) data instead of I-V characteristic curves has been proposed. See James C. Chen et al "E-T Based Statistical Modeling and Compact Statistical Circuit Simulation Methodologies", IEDM, 1996, pp. 635–638. That article describes a method of directly measuring parameters such as the change amount $\Delta L$ in the length of the channel, the change amount $\Delta W$ in the width of the channel, the thickness $T_{ox}$ of a gate insulating layer, and the drain-source resistance $R_{ds}$ among the model parameters, and extracting the remaining parameters using ET data such as drain saturation current $I_{dsat}$. However, it is more difficult to directly measure physical parameters than it is to measure the I-V characteristics. For example, it is very difficult to measure such parameters by a physical technique involving the use of a scanning electronic microscope. Accordingly, such parameters are usually measured by an indirect method by which the parameters are derived from electrical measurement. It is not possible to guarantee the reliability of such derived parameter values.

Of interest to integrated circuit designers is what influence do changes in specific characteristics of an elementary device of an integrated circuit design have on the performance of the entire integrated circuit. Also of interest are which characteristics of the device most greatly affect the performance of the integrated circuit. However, conventional techniques for extracting model parameters and evaluating integrated circuit designs do not adequately meet such needs.

SUMMARY OF THE INVENTION

It is an object of the present invention to provide a method of simply extracting model parameter sets when two or more model parameter sets are required in order to statistically simulate the performance of a circuit design.

It is another object of the present invention to provide a method of estimating sensitivity, i.e. determine the influence that changes in elementary device characteristics have on the performance of the entire circuit.

Accordingly, to achieve the first object, there is provided a method of extracting n (n being an integer greater than or equal to 2) model parameter sets in order to statistically simulate the operation and performance of an integrated circuit design, wherein a first model parameter set is extracted by a conventional method and the remaining n–1 model parameter sets are extracted using not an I-V characteristic curve but instead the main characteristic data of an elementary device as a target function.

In a method of extracting model parameter sets according to the present invention, n points are designated in one or more wafers and an elementary device of the integrated circuit is formed at each of the n points. An I-V characteristic curve is created by measuring the I-V characteristic of the elementary device formed at one point among the n points and a first model parameter set is extracted which converges on the I-V characteristic curve within a predetermined error range. With respect to the second through nth model parameter sets, the second through nth main characteristic data values of the elementary device formed at the remaining second through nth points are measured and the second through nth model parameter sets are extracted which converge on the main characteristic data values within a predetermined error range.

The elementary device may, for example, be a transistor and the main characteristic data may be one or more selected from the group consisting of a threshold voltage $V_{th}$, a drain saturation current $I_{Dsat}$, a maximum conductance $G_{mmax}$, a drain current $I_{off}$ (when a gate-source voltage is 0V), a junction capacitance $C_j$, and an overlap capacitance $C_{OV}$ of the transistor.

Also, the model parameters of the first model parameter set can be input as initial values for extracting the second through nth model parameter sets.

According to the method of simulating the integrated circuit according to the present invention, it is possible to analyze the influence that changes in the main characteristic data value have on the performance of the integrated circuit. The model parameter sets are extracted using the main characteristic data as the target function.

In a method of simulating the operation and the performance of a designed integrated circuit according to the present invention, an elementary device of the integrated circuit is formed at a predetermined point on a wafer. After creating an I-V characteristic curve by measuring the I-V characteristic of the elementary device, a first model parameter is extracted which converges on the I-V characteristic curve within a predetermined error range. A main characteristic data value of the elementary device is measured and the measured main characteristic data value is arbitrarily changed. A second model parameter set is then extracted which converges on the changed main characteristic data value within a predetermined error range. The first and second model parameter sets are input to a simulation program such as SPICE, the performances of the integrated circuit are simulated, and the simulated performances are compared with one another. Accordingly, the influence that the change in the main characteristic data value of the elementary device has on the performance of the integrated circuit design may be analyzed.

Here, the first model parameter set can be extracted using not the I-V characteristic curve but the main characteristic data as the target function.

According to the method of extracting n model parameter sets of the present invention, the simple-to-measure main characteristic data of the device (rather than the difficult-to-measure I-V characteristic curve) is used as the target function when those model parameter sets that follow the first model parameter set are extracted. Therefore, it is possible to significantly reduce the time spent on extracting the model parameter sets.

Also, the invention makes it possible to easily analyze the influence that changes in the characteristics of the device have on the performance of the circuit. This is because the main characteristic data of the device are used to extract the model parameter sets.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
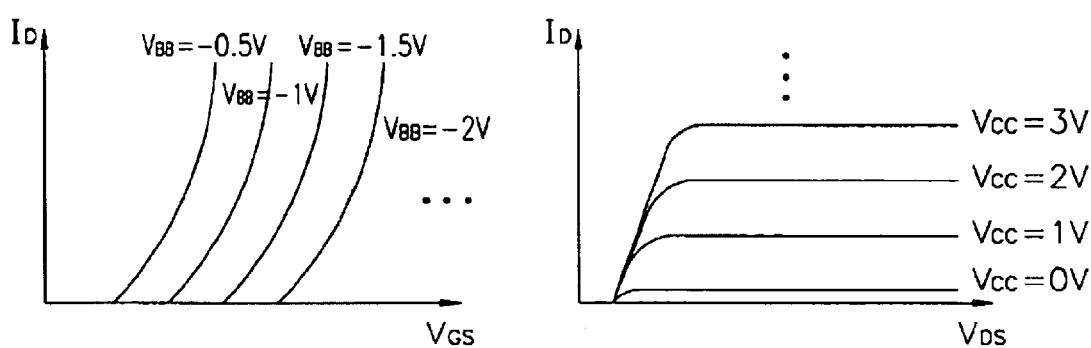
FIG. 1 shows examples of I-V characteristic curves which are created by measuring current values according to the change in voltages in order to extract model parameter sets.
Figure 2:
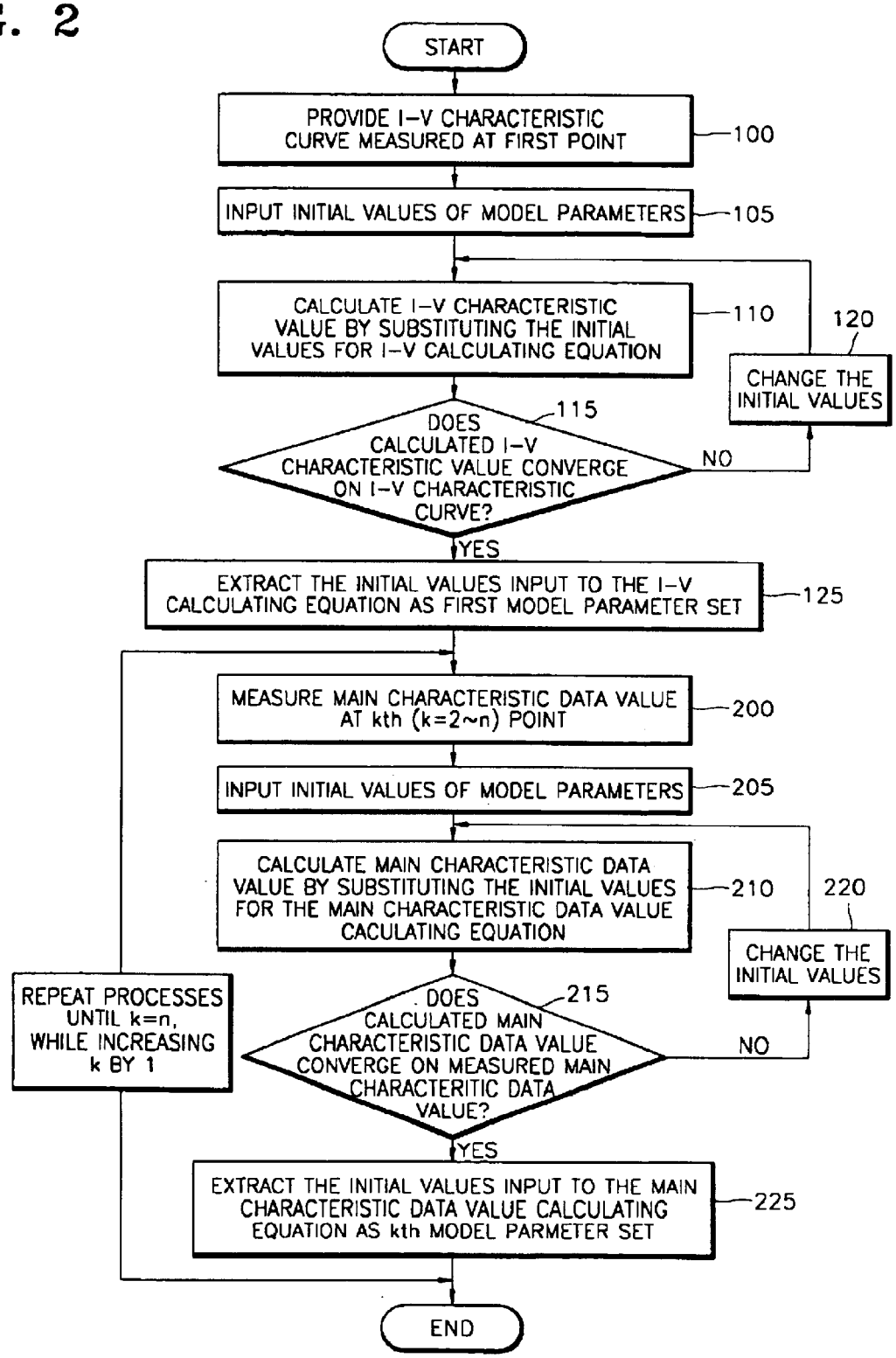
FIG. 2 is a flowchart showing a method of extracting model parameter sets according to the present invention.
Figure 3:
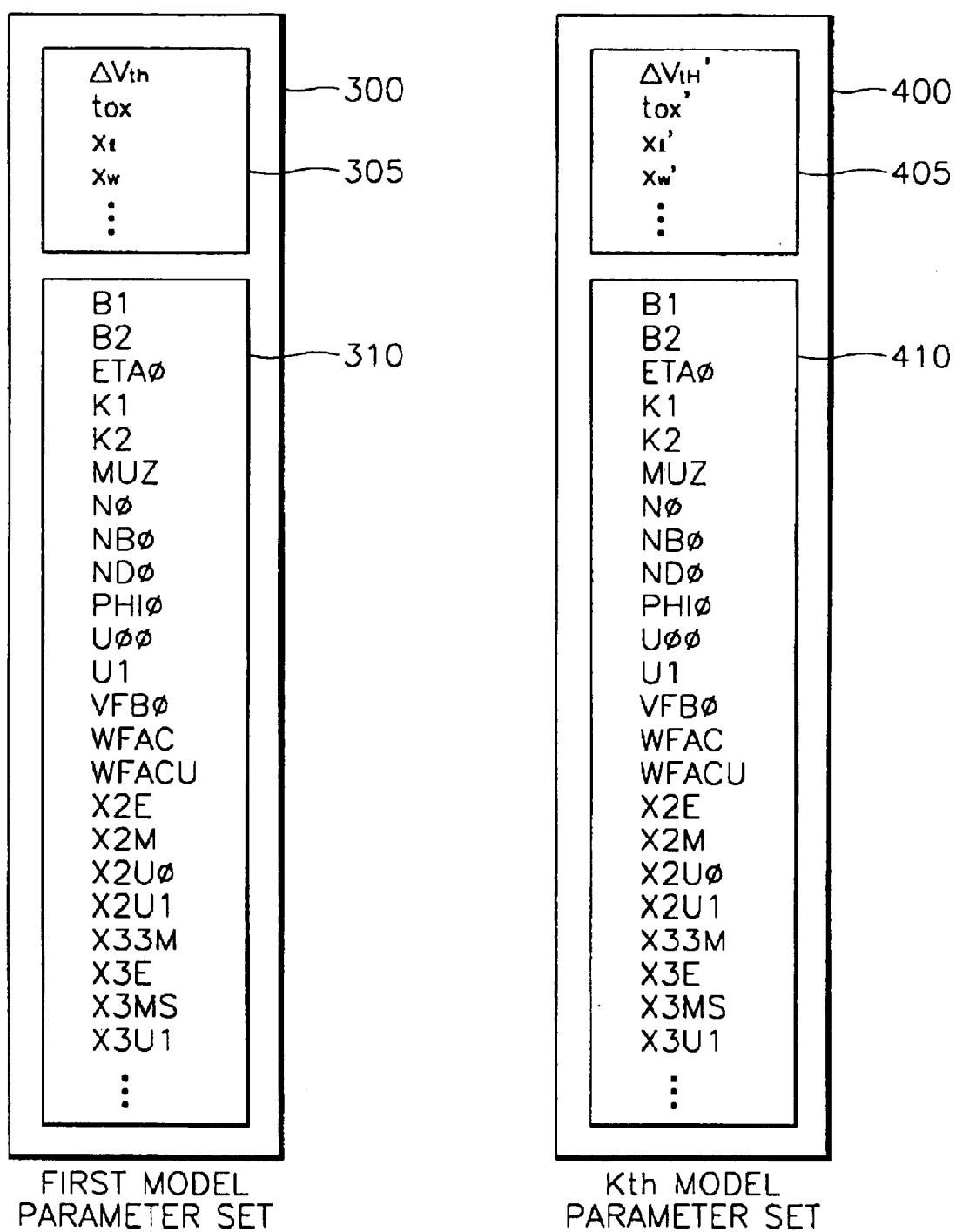
FIG. 3 tabulates a 1st model parameter set and a kth model parameter set, extracted according to the present invention.

FIG. 2 is a flowchart showing the process of extracting n model parameter sets according to the present invention. FIG. 3 shows a 1st model parameter set and a kth model parameter set, extracted according to the method illustrated in FIG. 2.

Referring first to FIG. 2, a method of extracting n model parameter sets according to the present invention includes a extracting a first model parameter set, steps 100 through 125, and a process of extracting a second through nth model parameter sets, steps 200 through 225. In the process of extracting the first model parameter set (steps 100 through 125), a measured I-V characteristic curve is used as a target function as is conventional, but the process of extracting the second through nth model parameter sets (steps 200 through 225) constitutes a novel technique according to the present invention.

N different points on one or more wafers are designated and an elementary device of a integrated circuit design such as a MOS transistor is formed at each designated point, in order to statistically simulate the operation and the performance of the integrated circuit.

An I-V characteristic curve is provided by measuring the I-V characteristic of the device formed at an arbitrary point (a first point) among the n points (step 100). It is desirable to create various characteristic curves by measuring the I-V characteristic, while changing the length and the width of the channel of the device, the temperature during measurement, the operating voltage, and for the substrate voltage, thereby to improve the accuracy of the simulation.

Next, initial values representing a first model parameter set are input (step 105). In this step, a previously known model parameter set of a device similar to the target elementary device design is selected, input or default values are provided by a SPICE program, and both are input as the initial values.

An I-V characteristic value is calculated by substituting the initial values for the I-V calculating equation of the SPICE program (step 110).

It is determined whether the I-V characteristic value calculated in step 110 converged on the I-V characteristic curve measured in step 100, i.e. whether the initial values appropriately reproduce the measured I-V characteristic curve (step 115). It will be understood that the I-V characteristic value calculated in this step typically will not exactly coincide with the measured I-V characteristic curve. Accordingly, it is considered that the I-V characteristic value has converged on the I-V characteristic curve when the difference between the I-V characteristic value and the I-V characteristic curve is within a predetermined error range.

Typically, the I-V characteristic value calculated by the original initial values input in the step 105 does not converge to the measured I-V characteristic curve. Accordingly, the initial values input in step 105 typically are changed (step 120). Then, the I-V characteristic value is calculated again by substituting the changed initial values into the I-V calculating equation (step 110). In the process of changing the initial values (step 120), differences between the calculated I-V characteristic values and the measured I-V characteristic curves are evaluated. For example, it maybe that the calculated I-V characteristic value coincides with the measured I-V characteristic curve in the linear region of the I-V characteristic curve and the calculated I-V characteristic value is quite different from the measured I-V characteristic curve in the saturation region of the I-V characteristic curve. Or, conversely, it may be that the calculated I-V characteristic value coincides with the measured I-V characteristic curve in the saturation region of the I-V characteristic curve and the calculated I-V characteristic value is quite different from the measured I-V characteristic curve in the linear region of the I-V characteristic curve. Appropriate parameters (initial values) are changed according to the nature and extent of the difference. Preferably, the parameters are automatically changed and re-calculated by a known subprogram of the SPICE program (for which a plurality of optimization algorithms have been provided) and the Levenberg-Marquardt (L-M) algorithm using a least square method. (Refer to N. Arora, MOSFET Models for VLSI Circuit Simulation-Theory and Pranctice, Springer-Verlag, 1993, pp. 510–535).

When the I-V characteristic value calculated in the step 110 converges on the measured I-V characteristic curve, the initial values which are finally input to the I-V calculating equation are extracted as a first model parameter set (step 125). In other words, a first model parameter set 300 shown in FIG. 3 is created. Each of the model parameter sets 300 and 400 shown in FIG. 3 is divided into two parts, that is, a part relating physical attributes 305 and 405 (the physical attributes of the parameters are described above) and a simple coefficient part 310 and 410 of the SPICE model equation (Refer to HSPICE User's Manual, Meta-Software Inc., 1996, pp.16–103 through 16–106; and with respect to the detailed meanings of the illustrated coefficients).

In the process of extracting model parameter sets with respect to the devices formed at the remaining n-1 points, the model parameter sets preferably are extracted by using several measured main characteristic data as a target function (rather than using the measured I-V characteristic curve).

Namely, the main characteristic data values of the devices formed at a second point which is not the first point among n points are measured (step 200). ET data best representing the characteristic of the device, e.g. threshold voltage $V_{th}$, saturation current $I_{Dsat}$, a maximum conductance $G_{mmax}$, drain current when $V_{GS}=0V$ ($I_{off}$), junction capacitance $C_j$, and overlap capacitance $C_{DV}$ belong to the main characteristic data. These data can be obtained directly by a simple electrical measurement without resort to scanning electronic microscope or a complicated evaluation process. This distinguishes main characteristic data from, for example, the amount of change $\Delta L$ in the length of the channel, the amount of change $\Delta W$ in the width of the channel and the thickness $T_{ox}$ of a gate insulating layer. Further, the main characteristic data can be obtained by relatively few measurements. Therefore, it takes much less time and it is much easier to measure the main characteristic data than the I-V characteristic curve.

The result of extracting the model parameters using only the main characteristic data which can be simply measured as the target function is not significantly different from the result of extracting the model parameters using the I-V characteristic as the target function. First of all, the model parameter sets of the devices formed at various points are extracted and the operation and the performance of the integrated circuits formed at various points are simulated in order to observe the deviation of the performances of the integrated circuits according to their positions in a wafer or a wafer cassette. In this case, the difference in the performances according to the positions in the wafer or the wafer cassette can be determined from the main characteristic data without resort to I-V characteristic curve measurements. This is because the difference in the I-V characteristic curves according to the positions is almost directly represented by the difference in the main characteristic data values of the device according to the positions (the first model parameter set having been extracted by using the measured I-V characteristic curve).

The initial values which will become the second model parameter sets are input (step 205). In this step, the previously extracted first model parameter set (300 of FIG. 3) is preferably directly input as the initial values. This is because the model parameter sets corresponding with the second through nth points are expected to be similar to the first model parameter set.

The main characteristic data value is calculated by substituting the initial values for the calculating equation of the main characteristic data value of the SPICE program (step 210).

It is determined whether the main characteristic data value calculated in step 210 has converged on the main characteristic data value measured in step 200 (step 215). When the difference between the main characteristic data value calculated in step 210 and the main characteristic data value measured in step 200 is within a predetermined error range, it is concluded that the main characteristic data value calculated in step 210 has converged on the main characteristic data value measured in step 200.

When it is determined that the main characteristic data value calculated in step 210 has not converged on the main characteristic data value measured in step 200, the initial values are changed (step 220). Then, the main characteristic data value is calculated again by substituting the changed initial values for the calculating equation of the main characteristic data value.(step 216). In the step of changing the initial values (step 220), the above-mentioned optimization program can be used. Also, it is possible to change only parameters 305 having physical attributes without changing all the initial values (305 and 310 of FIG. 3). This is because the parameters 305 having physical attributes among the model parameters change according to the conditions of actual processes and the remaining simple coefficient part 310 need not be changed according to the change in the positions in a wafer or wafer cassette. This is because the coefficients 310 have little relation to the change in the conditions of actual processes.

When the main characteristic data value calculated in step 210 has converged on the measured main characteristic data value, the initial values finally input to the calculating equation of the main characteristic data value are extracted as the second model parameter set (400 of FIG. 3). As shown in FIG. 3, among model parameters of the second (k=2) model parameter set 400, model parameters which are different from those of the first model parameter set 300 are only the parameters 405 having physical attributes. This means that it is easier to create the target function and it is advantageous to the convergence of a solution to consider only those parameters (less than 10) having physical attributes according to the change in the processing conditions in the optimizing step (step 220).

The third through nth model parameter sets are extracted by repeating steps 200 through 225.

Designating the first point for extracting the first model parameter set is arbitrary. However, after measuring the main characteristic data value of all the devices formed at n points, the device at the point where the main characteristic data value is closest to the specification of the integrated circuit design can be a reference sample (the first point).

According to the method of extracting n model parameter sets according to the present invention, it is possible to significantly reduce the time spent extracting the model parameter sets. This is accomplished by extracting the model parameter sets by measuring the I-V characteristic once and measuring only the main characteristic data (which can be easily measured the remaining (n−1) times), instead of by measuring the I-V characteristic (which takes a long time to measure and which is difficult to measure).

EXPERIMENT EXAMPLE 1

Figure 4:
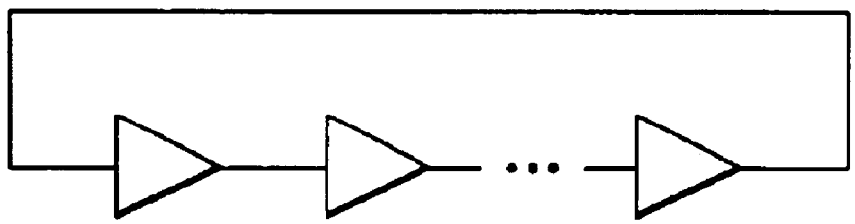
FIG. 4 is a circuit diagram showing a ring oscillator as an exemplary integrated circuit design to be simulated.

The time delay through an 11-stage ring oscillator formed of CMOS transistors as shown in FIG. 4 is simulated in order to check the accuracy of the simulation of the method according to the present invention. Transistor devices are formed at ten points across three wafers. Ten model parameter sets are extracted by the conventional method, in which the I-V characteristic curves are provided with respect to all the devices formed at the ten points. Other ten model parameter sets are extracted by the method according to the present invention, in which one model parameter set is extracted by measuring the I-V characteristic with respect to only the reference sample formed at one point and the remaining nine model parameter sets are extracted by measuring only a threshold voltage and a drain saturation current as the main characteristic data. Time delay is simulated by inputting the respective 10 model parameter sets extracted by the conventional method and the method according to the present invention.

The results of simulating time delay with the model parameter sets extracted by the conventional method and by the method according to the present invention, with respect to four combinations of operating voltage Vcc and temperature, are shown in Table 1. The mean error of the results of the time delay is 3.15%, which is excellent.

TABLE 1

| Simulation conditions | | |
|---|---|---|
| $V_{CC}$ (V) | Temperature (° C.) | Mean error (%) |
| 2.5 | 85 | 3.3 |
| 2.5 | 110 | 3.1 |
| 3.0 | 85 | 3.5 |
| 3.0 | 110 | 2.7 |
| Mean | | 3.15 |

Figure 5:
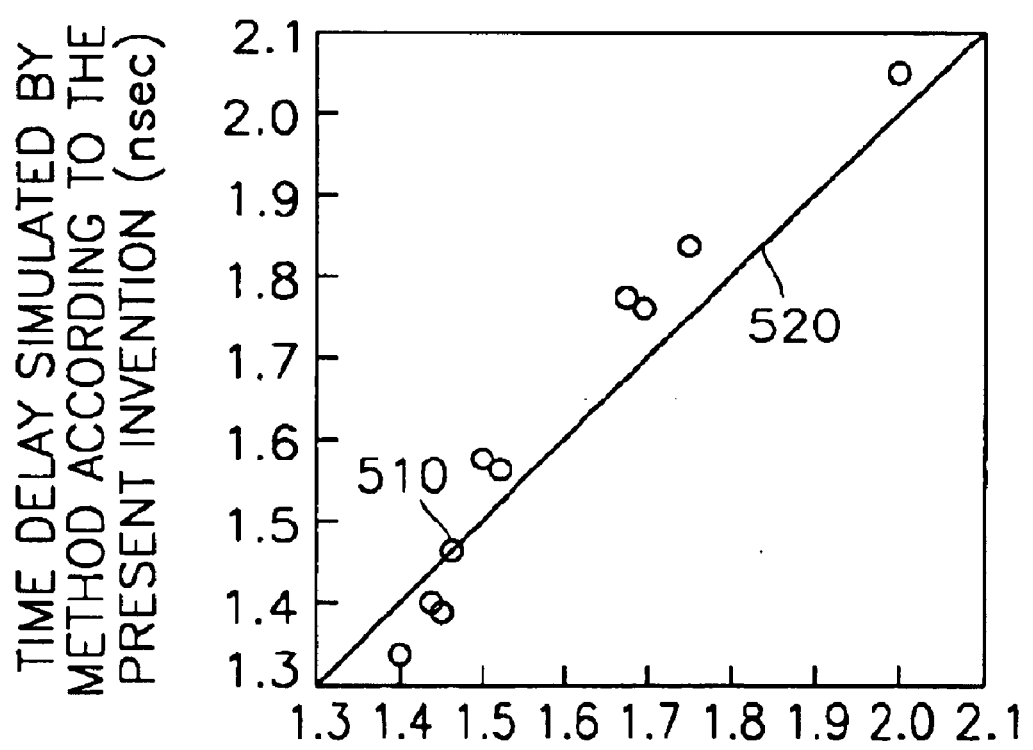
FIG. 5 is a correlation diagram showing results of simulation of the ring oscillator using model parameter sets extracted by the conventional method and by a method according to the present invention.

FIG. 5 is a graph showing the results of simulating the time delay with respect to the model parameter sets extracted by the conventional method and the method according to the present invention when $V_{CC}$ is 2.5V and the temperature is 85° C. (the first entry in Table 1). Referring to FIG. 5, it may be seen that the result of simulating the time delay by the method according to the present invention closely coincides with the result of simulating the time delay by the conventional method. Namely, time delay 510 simulated with respect to the reference sample using the first model parameter set extracted using the I-V characteristic curve as the target function and remaining nine simulated time delays are distributed closely along a diagonal straight line 520. Thus, the graph illustrates that the result of simulating the time delay by the method according to the present invention closely coincides with the result of simulating the time delay by the conventional method. The above assumption-that the difference in the main characteristic data values of the devices according to the positions on the wafer directly represents the difference in the I-V characteristic curves-is verified.

Also, according to the method of extracting the model parameter sets of the present invention, it is possible to analyze the sensitivity, i.e. the influence that the ET data (the main characteristic data) has on the performance of the circuit. Namely, according to the present invention, it is possible to estimate the change in performance of the integrated design circuit according to the change in device characteristics without manufacturing the device whose characteristics (ET data) are changed. Further, it is possible to analyze the characteristic of the device that has the greatest influence on the performance of the integrated circuit design by comparing a) the result of simulating performance with respect to the model parameter set extracted using the I-V characteristic curve or the ET data as the target function with b) the result of simulating performance with respect to the model parameter set extracted using changed ET data as the target function. The following experiment examples show an example of such sensitivity analyses.

EXPERIMENT EXAMPLE 2

After extracting the model parameter set with respect to one reference sample and simulating the time delay of a 23-stage ring oscillator using the model parameter set, corresponding time delays using the model parameter sets extracted while changing the ET data are simulated, and the two are compared with each other. The simulated time delay of the reference sample was 3.28 nsec. The simulated time delays and the change ratios when the ET data is changed are shown in Table 2. In Table 2, $C_{ja}$, $C_{jp}$, $C_{OV}$, $I_{Dsat}$, and $V_{th}$ denote a junction capacitance of source/drain regions to a channel, junction capacitance of the source/drain regions to a substrate, overlap capacitance, drain saturation current, and threshold voltage, respectively. For example, $I_{Dsat}$-10% means that $I_{dsat}$, is reduced by 10% and the remaining characteristics are maintained.

TABLE 2

| | Changed ET data | Time delay (nsec) | Change ratio of time delay (%) |
|---|---|---|---|
| NMOS | $C_{ja}$ + 15% | 3.29 | 0.5 |
| | $C_{jp}$ + 15% | 3.29 | 0.4 |
| | $C_{ov}$ + 15% | 3.32 | 1.3 |
| | $I_{DSat}$ − 10% | 3.50 | 6.8 |
| | $V_{th}$ + 10% | 3.27 | 0.1 |
| PMOS | $C_{ja}$ + 15% | 3.33 | 1.6 |
| | $C_{jp}$ + 15% | 3.30 | 0.7 |
| | $C_{ov}$ + 15% | 3.37 | 2.9 |
| | $I_{DSat}$ + 10% | 3.62 | 10.4 |
| | $V_{th}$ − 10% | 3.23 | 0.2 |

It is noted from Table 2 that the factor that has the greatest influence on the time delay of the ring oscillator is $I_{Dsat}$ whether NMOS or PMOS transistors are used in the invention.

EXPERIMENT EXAMPLE 3

With respect to an asynchronous DRAM, after extracting the model parameter set of one reference sample and simulating $t_{RAC}$ (access time from when an address is designated to when data is read) using the model parameter set, $t_{RAC}$ is simulated using the model parameter sets extracted while changing the ET data, and the two are compared with each other. $t_{RAC}$ is 40 nsec when $V_{CC}$ is 3.0V and the temperature is 75° C. on the average. The influence (the sensitivity) that the change in each ET data has on $t_{RAC}$ is shown in Table 3. In Table 3, $I_{Dp}$, $I_{Dn}$, $R_{pp}$, and $C_{para}$ denote $I_{Dsat}$, of the PMOS transistor, $I_{Dsat}$ of the NMOS transistor, the resistance of an upper electrode line formed of polycrystalline silicon, and the parasitic capacitance of metal wiring, respectively.

TABLE 3

| ET data | Influence that change in each ET data has on $t_{RAC}$ (sensitivity) (%) |
|---|---|
| $I_{Dp}$ | 36 |
| $I_{Dn}$ | 21 |
| $R_{pp}$ | 18 |
| $C_{para}$ | 6 |
| Others | 19 |

It is noted from Table 3 that the factor that has the greatest influence on $t_{RAC}$ is the change in the saturation current of the PMOS transistor. Accordingly, a DRAM designer can estimate the influence that the changes in the characteristics of a DRAM have on the performance of an entire DRAM circuit without actually manufacturing a DRAM whose characteristics are changed.

According to the present invention, in the case of extracting n model parameter sets in order to statistically simulate the performance of the integrated circuit, it is possible to significantly reduce the time spent on extracting the model parameters by extracting only one model parameter set using the I-V characteristic curve created by directly measuring the I-V characteristic of the device as a target function and extracting the remaining (n-1) model parameter sets, using the main characteristic data (ET data) that can be easily measured, e.g. the threshold voltage or saturation current of the device as the target function.

According to the present invention, since the main characteristic data (ET data) of the device is used as the target function, it is possible to easily extract the model parameter set when the characteristics of the device are changed. Therefore, the designer can simply estimate the influence (sensitivity) that the changes in the characteristics of the device have on the performance of the integrated circuit.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A method of extracting n wherein n is a natural number greater than or equal to 2, model parameter sets in order to statistically simulate the operation and the performance of an integrated circuit design, the method comprising:

designating n points in one or more wafer and forming an elementary device of the integrated circuit at each of the n points;

creating an I-V characteristic curve by measuring the I-V characteristic of the elementary device formed at one point among the n points;

using the I-V characteristic curve to extract a first model parameter set which reproduces the I-V characteristic curve within a predetermined error range;

measuring a main characteristic data value of the elementary device formed at a kth, wherein k is a natural number from 2 to n, point among the n points; and extracting a kth model parameter set which converges on the main characteristic data value within a predetermined error range, wherein n model parameter sets are extracted by repeating the steps of measuring the main characteristic data value until k is equal to n, increasing k by one, and extracting the kth model parameter set.

2. The method of claim 1, wherein the elementary device is a transistor and the main characteristic data are one or more selected from the group consisting of a threshold voltage Vth, a drain saturation current IDsat, a maximum conductance Gmmax, a drain current Ioff when a gate-source voltage is 0V, a junction capacitance Cj, and an overlap capacitance Cov of the transistor.

3. The method of claim 2, wherein the main characteristic data is the threshold voltage Vth and the drain saturation current IDsat of the transistor.

4. The method of claim 1, wherein the step of extracting the kth model parameter set comprises the steps of:

inputting the first model parameter set as initial values of model parameters which will become the kth model parameter set;

calculating a main characteristic data value by substituting the initial values for the calculating equation of the main characteristic data value;

determining whether the calculated main characteristic data value converges on the measured main characteristic data value within a predetermined error range;

extracting the initial values as the kth model parameter set when it is determined that the calculated main characteristic data value converges on the measured main characteristic data value; and changing the initial values when the difference between the calculated main characteristic data value and the measured main characteristic data value deviates from the predetermined error range and repeating the steps of calculating the main characteristic data value and determining whether the calculated main characteristic data value converges on the measured main characteristic data value within a predetermined error range.

5. The method of claim 4, wherein the initial values are changed only in model parameters having physical attributes.

6. The method of claim 1, further comprising the step of arbitrarily changing the measured main characteristic data value of the elementary device formed at an m, wherein m is an arbitrary natural number from 1 to n, point and extracting an mth model parameter set which converges on the arbitrarily changed main characteristic data value within a predetermined error range, in order to analyze the influence that the change in the main characteristic data value of the elementary device has on the performance of the integrated circuit design.

7. A method of simulating the operation and the performance of an integrated circuit design, the method comprising the steps of:

forming an elementary device of the integrated circuit at a predetermined point on a wafer;

creating an I-V characteristic curve by measuring the I-V characteristic of the elementary device;

using the I-V characteristic curve to extract a first model parameter which reproduces the I-V characteristic curve within a predetermined error range;

measuring a main characteristic data value of the elementary device;

arbitrarily changing the main characteristic data value and extracting a second model parameter set which converges on the changed main characteristic data value within a predetermined error range; and inputting the first and second model parameter sets to a simulation program, simulating the performances of the integrated circuit based on the first and second model parameter sets, and comparing the simulated performances with each other, thereby analyzing the influence that the change in the main characteristic data value of the elementary device has on the performance of the integrated circuit design.

8. The method of claim 7, wherein the elementary device is a transistor, the main characteristic data are one or more selected from the group consisting of a threshold voltage Vth, a drain saturation current IDsat, a maximum conductance Gmmax, a drain current Ioff when a gate-source voltage is 0V, a junction capacitance Cj, and an overlap capacitance Cov of the transistor, each influence that the change in the main characteristic data value has on the performance of the integrated circuit design being analyzed by individually changing one value among the main characteristic data or combining two or more values with each other to produce change or combination results for purposes of extracting the second model parameter set.

9. The method of claim 7, where the simulation program is SPICE.

10. A method of simulating the operation and the performance of an integrated circuit design, comprising the steps of:

forming an elementary device of the integrated circuit at a predetermined point on a wafer;

measuring a main characteristic data value of the elementary device;

using the I-V characteristic curve to extracting a first model parameter set which reproduces the main characteristic data value within a predetermined error range;

arbitrarily changing the main characteristic data value and extracting a second model parameter set which converges on the changed main characteristic data value within a predetermined error range; and inputting the first and second model parameter sets to a simulation program, simulating the performances of the integrated circuit, and comparing the simulated performances with each other, thereby the influence that the change in the main characteristic data value of the elementary device has on the performance of the integrated circuit is analyzed.

11. The method of claim 10, wherein the elementary device is a transistor, the main characteristic data are one or more selected from the group consisting of a threshold voltage Vth, a drain saturation current IDsat, a maximum conductance Gmmax, a drain current Ioff when a gate-source voltage is 0V, a junction capacitance Cj, and an overlap capacitance Cov of the transistor, each influence that the change in the main characteristic data value has on the performance of the integrated circuit being analyzed by individually changing one value among the main characteristic data or combining two or more values with each other to produce change or combination results for purposes of extracting the second model parameter set.

12. The method of claim 10, wherein the simulation program is SPICE.

* * * * *

UNITED STATES PATENT AND TRADEMARK OFFICE
CERTIFICATE OF CORRECTION

PATENT NO.   : 6,795,800 B1
DATED        : September 21, 2004
INVENTOR(S)  : Lee It is certified that error appears in the above-identified patent and that said Letters Patent is hereby corrected as shown below:

Column 1,
Line 28, "length $X_1$ and the width $X_w$ of" should read -- length $x_1$ and the width $x_w$ of --.

Column 2,
Line 39, "resistance $R_{d5}$ among" should read -- resistance $R_{ds}$ among --.

Column 6,
Line 7, "capacitance $C_{DV}$ belong" should read -- capacitance $C_{ov}$ belong --.
Line 66, "value.(step 216)." should read -- value (step 210). --.

Column 12,
Line 17, "curve to extracting a first" should read --curve to extract a first --.

Signed and Sealed this

Twenty-eighth Day of June, 2005

JON W. DUDAS
*Director of the United States Patent and Trademark Office*